(12) United States Patent
Kim

(10) Patent No.: US 7,694,648 B2
(45) Date of Patent: Apr. 13, 2010

(54) ORGANIC EL DISPLAY DEVICE AND METHOD FOR FABRICATING THE SAME

(75) Inventor: Chang Nam Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/023,603

(22) Filed: Dec. 29, 2004

(65) Prior Publication Data

US 2005/0109273 A1    May 26, 2005

Related U.S. Application Data

(63) Continuation of application No. 10/185,012, filed on Jul. 1, 2002, now Pat. No. 6,884,139.

(30) Foreign Application Priority Data

Jul. 3, 2001    (KR)    ............... 10-2001-39542

(51) Int. Cl.
B05C 17/06    (2006.01)
(52) U.S. Cl. ............ 118/504; 118/505; 313/402; 313/403
(58) Field of Classification Search ......... 118/504, 118/505; 427/282; 313/402, 403; 438/942, 438/944
See application file for complete search history.

(56) References Cited

U.S. PATENT DOCUMENTS

| | | | | |
|---|---|---|---|---|
| 4,256,532 A | * | 3/1981 | Magdo et al. | 216/2 |
| 4,756,793 A | * | 7/1988 | Peek | 438/524 |
| 4,973,879 A | * | 11/1990 | Fujimura | 313/403 |
| 5,079,477 A | * | 1/1992 | Yamamoto | 313/403 |
| 5,523,647 A | * | 6/1996 | Kawamura et al. | 313/407 |
| 5,937,272 A | | 8/1999 | Tang | 438/30 |
| 6,087,772 A | | 7/2000 | Ootsuki et al. | 313/505 |
| 6,501,098 B2 | | 12/2002 | Yamazaki | 257/72 |
| 6,592,933 B2 | | 7/2003 | Himeshima et al. | 427/66 |
| 6,611,089 B2 | * | 8/2003 | Kim et al. | 313/407 |
| 6,650,044 B1 | | 11/2003 | Lowery | 313/502 |
| 6,686,215 B2 | | 2/2004 | Yamada | 438/22 |

FOREIGN PATENT DOCUMENTS

| | | | | |
|---|---|---|---|---|
| EP | 0 883 190 A2 | | 12/1998 | |
| EP | 0 955 791 A1 | | 11/1999 | |
| JP | 60235326 A | * | 11/1985 | |
| JP | 5-43387 | * | 2/1993 | ............ 427/282 |
| JP | 11-195490 A | | 7/1999 | |
| JP | 11-214154 | | 8/1999 | |
| JP | 11-214154 A | | 8/1999 | |
| JP | 2000-299190 | | 10/2000 | |
| JP | 2001-148291 | | 5/2001 | |

* cited by examiner

*Primary Examiner*—Laura Edwards
(74) *Attorney, Agent, or Firm*—Holland & Knight LLP

(57) ABSTRACT

An organic EL display device and a method for fabricating the same are disclosed, wherein an organic luminescence layer is formed at a crossing region of first and second electrodes using a shadow mask on which a plurality of holes are connected by bridges.

3 Claims, 8 Drawing Sheets first R deposition second R deposition second R deposition deposition of G and B (twice respectively)

six times' deposition of organic luminescence layer after six times' alignment of it R deposition G deposition three times' deposition of organic luminescence layer after three times' alignment of it

ORGANIC EL DISPLAY DEVICE AND METHOD FOR FABRICATING THE SAME

This application is a Continuation of U.S. patent application Ser. No. 10/185,012, filed Jul. 1, 2002, now U.S. Pat. No. 6,884,139, and claims the benefit of the Korean Application No. 2001-0039542 filed on Jul. 3, 2001, which are hereby incorporated by reference.

BACKGROUND OF THE INVENTION

1. Field of the Invention

The present invention relates to a display device, and more particularly, to an organic electroluminescence (EL) display device and a method for fabricating the same.

2. Discussion of the Related Art

A method of using a shadow mask as shown in FIG. 1 is the most efficient method to improve the luminescence efficiency among methods of forming R, G, and B pixels in fabricating a full-color organic EL display device.

FIGS. 1A to 1D are diagrams showing a related art shadow mask and a full-color organic EL display device according to a pixel array method.

As shown in FIG. 1A, an first electrode 2 is formed on a transparent substrate 1 and barriers 7 are additionally formed on the same to separate between an insulating film 3 and a second electrode.

Also, using a shadow mask 6, a common luminescence layer 5 of R, G, and B, and each of organic luminescence layers 5-1 to 5-3 of R, G, and B is formed at a corresponding pixel on the insulating film 3.

Then, the second electrode is formed on the entire surface.

There are three different types (i.e. a strip type as shown in FIG. 1B, a delta type as shown in FIG. 1C, and an array type as shown in FIG. 1D) in forming an organic luminescence layer using a shadow mask depending on the array method of a pixel. In the array type, the size of R pixel is designed to be larger than G or B pixel to supplement the luminescence efficiency of the R pixel.

The strip type is best among the above three pixel array types in terms of the aperture ratio and first electrode resistance. In other words, because first electrodes are formed in the form of strips, the device can be driven with low driving voltage.

On the other hand, in the strip type, the shadow mask 6 should also be made in a strip form as shown in FIG. 1. In this instance, problems such as the transformation or droop of the shadow mask 6 are caused in a large degree because of an external pulling strength. Accordingly, in the process of deposition, colors spread not only on the intended pixel region but also on other areas because of shadow effect.

To obviate the above-mentioned problems, as shown in FIG. 2, a shadow mask on which mask holes are made in turns while having the same pixel array structure as that of the strip type of FIG. 1B is applied.

FIGS. 2A to 2D are deposition process diagrams of an organic luminescence layer of a full-color organic EL display device using the related art shadow mask structure.

In this method, however, each organic luminescence layer displaying one of R, G, and B colors should be formed by carrying out alignment and deposition twice respectively. That is, to form three layers of R, G, and B, the deposition should be carried out six times in all after the alignment being carried out six times as well.

In other words, to form organic luminescence layers of R, G, and B, in case of using the shadow mask 6 of FIGS. 1B to 1D, the shadow mask is aligned and deposited three times respectively. In case of using a shadow mask shown in FIG. 2, however, the shadow mask should be deposited 6 times.

SUMMARY OF THE INVENTION

Accordingly, the present invention is directed to an organic EL display device and method for fabricating the same that substantially obviates one or more problems due to limitations and disadvantages of the related art.

An object of the present invention is to provide a full-color organic EL display device and a method for fabricating the same, in which an improved shadow mask structure is provided to prevent a mask pattern from being transformed, thereby obtaining high luminescence efficiency.

Another object of the present invention is to provide a full-color organic EL display device and a method for fabricating the same which has a shadow mask structure that provides a predetermined number of bridges formed over a long strip-shaped holes so as to prevent transformation and droop caused by a pulling strength from occurring, thereby obtaining high aperture ratio and low driving voltage.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a full-color organic EL display device of the present invention includes organic luminescence layers of R, G, and B formed in a strip shape at a plurality of pixels, which are defined by a crossing region of first and second electrodes, on a transparent substrate using a mask which has a plurality of strip-shaped holes and a plurality of bridges crossing the holes.

In the preferred embodiment of the present invention, thin metal that act as bridges is formed over long strip-shaped holes of a shadow mask so as to prevent the shadow mask from being transformed or drooped because of the pulling strength. The organic luminescence layers of R, G, and B are alternately arranged in rows by three times' alignments of the shadow mask.

To further achieve these objects and other advantages and in accordance with the purpose of the invention, as embodied and broadly described herein, there is provided a mask for fabricating a display device that includes a plate having a plurality of holes, and a plurality of bridges connecting the holes, wherein the bridges are formed on the same or different plane as the plate.

To further achieve these objects and other advantages and in accordance with the purpose of the invention, as embodied and broadly described herein, there is provided a mask for fabricating a display device that includes a plate having a plurality of holes, and a plurality of bridges connecting the holes, wherein the bridges are formed on the same or different plane as the plate and thicker than the plate.

To further achieve these objects and other advantages and in accordance with the purpose of the invention, as embodied and broadly described herein, there is provided a mask for fabricating a display device that includes a plate having a plurality of holes, and a plurality of bridges connecting the holes, wherein the bridges are formed on the same or different plane as the plate and at the same thickness from that of the plate.

To further achieve these objects and other advantages and in accordance with the purpose of the invention, as embodied and broadly described herein, there is provided a mask for fabricating a display device that includes a plate having a plurality of holes, and a plurality of bridges formed between the adjacent holes, wherein the bridges are formed on the same or different plane as the plate and thicker than the plate.

To further achieve these objects and other advantages and in accordance with the purpose of the invention, as embodied and broadly described herein, there is provided a mask for fabricating a display device that includes a plate having a plurality of holes, and a plurality of bridges formed between the adjacent holes, wherein the bridges are formed on the same or different plane as the plate and at the same thickness from that of the plate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 3A to 3D illustrate deposition process diagrams of an organic luminescence layer of a full-color organic EL display device using a shadow mask structure of the present invention.

Figure 1A:
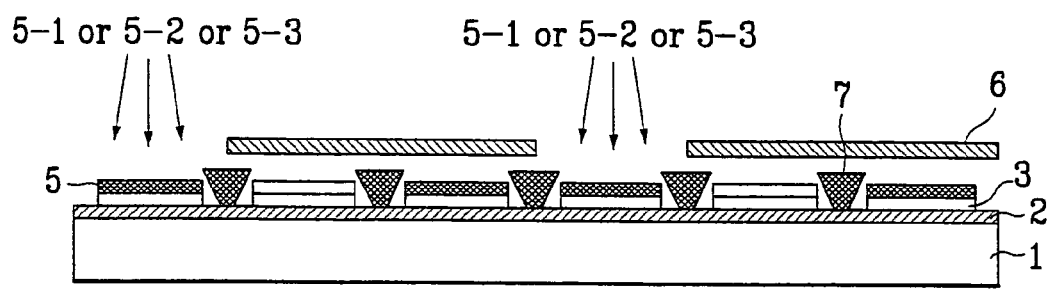
FIGS. 1A to 1D illustrate diagrams showing full-color organic EL display devices in accordance with pixel array types and related art shadow masks.
Figure 1B:
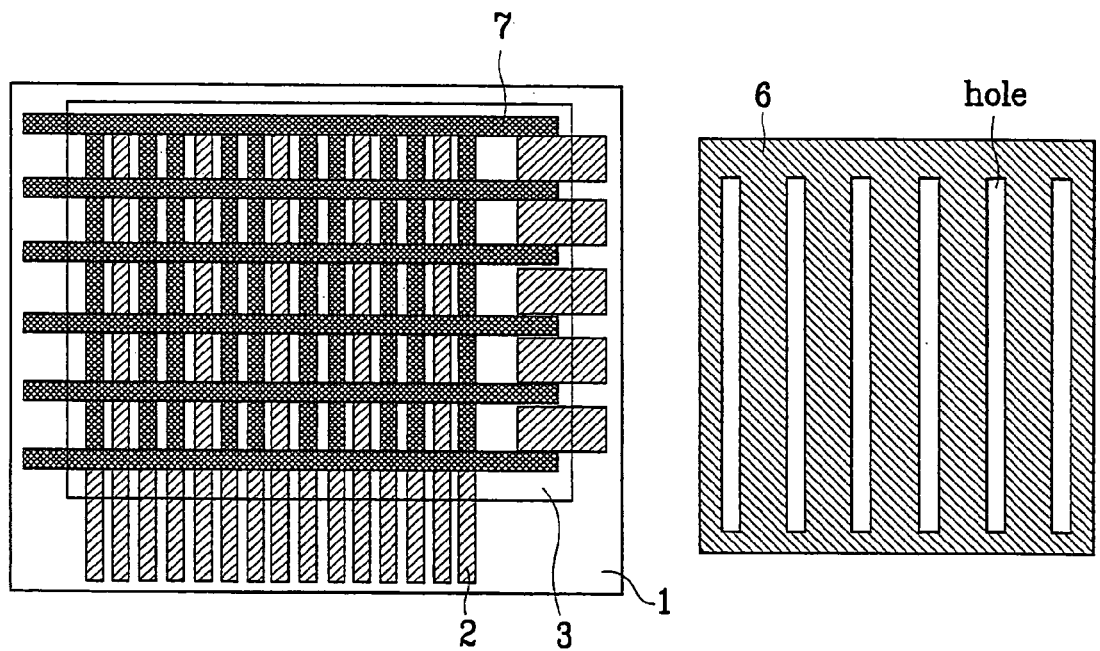
Figure 1C:
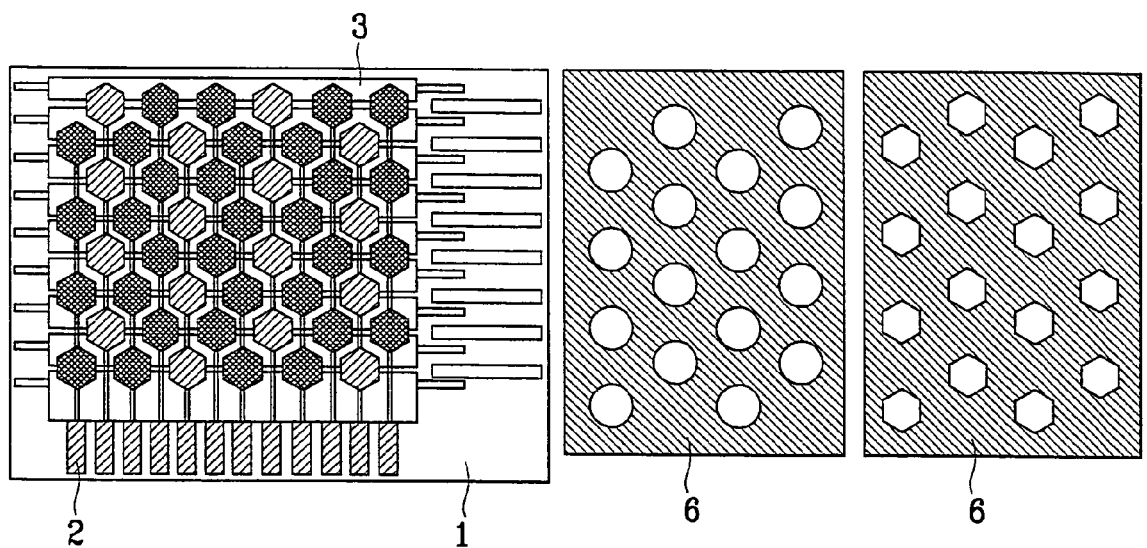
Figure 1D:
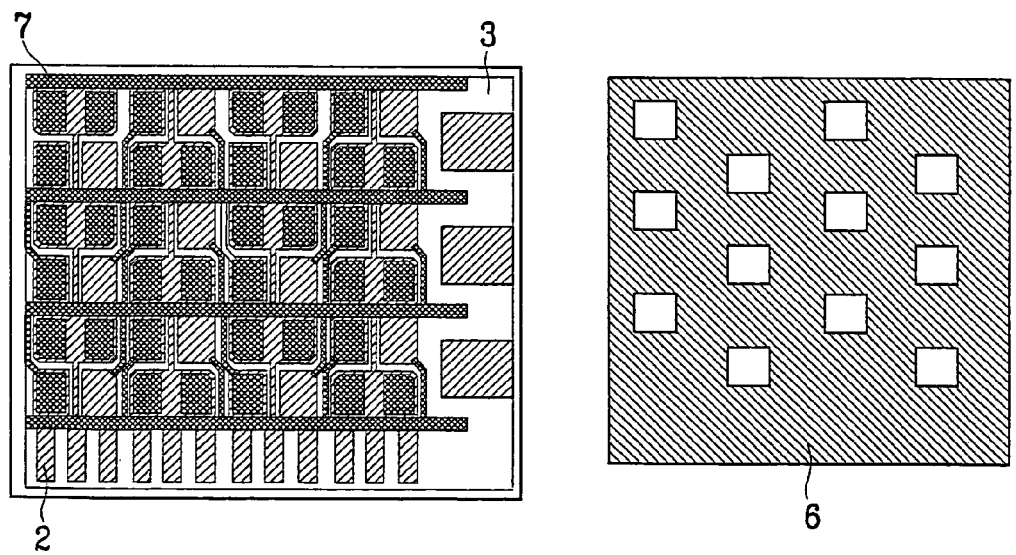
Figure 2A:
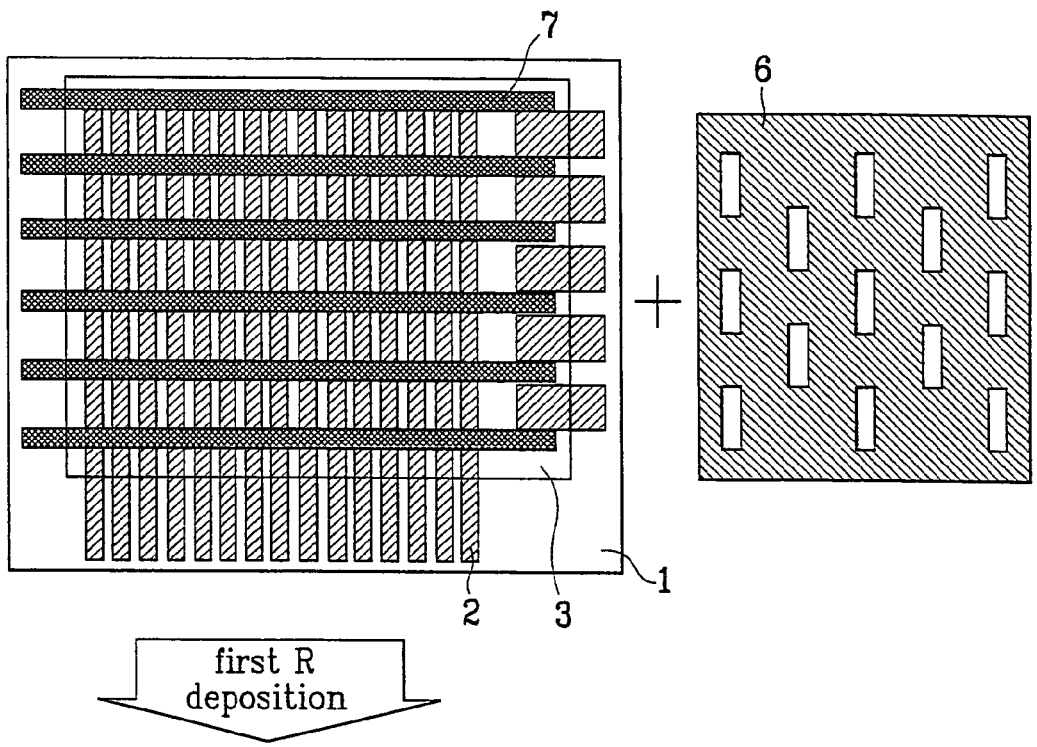
FIGS. 2A to 2D illustrate deposition process diagrams of an organic luminescence layer of a full-color organic EL display device using a shadow mask structure of a related art.
Figure 2B:
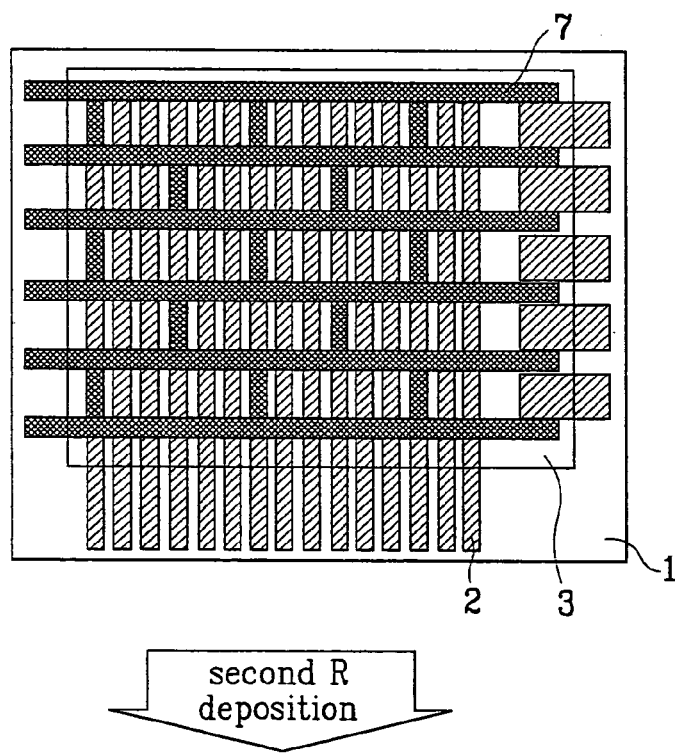
Figure 2C:
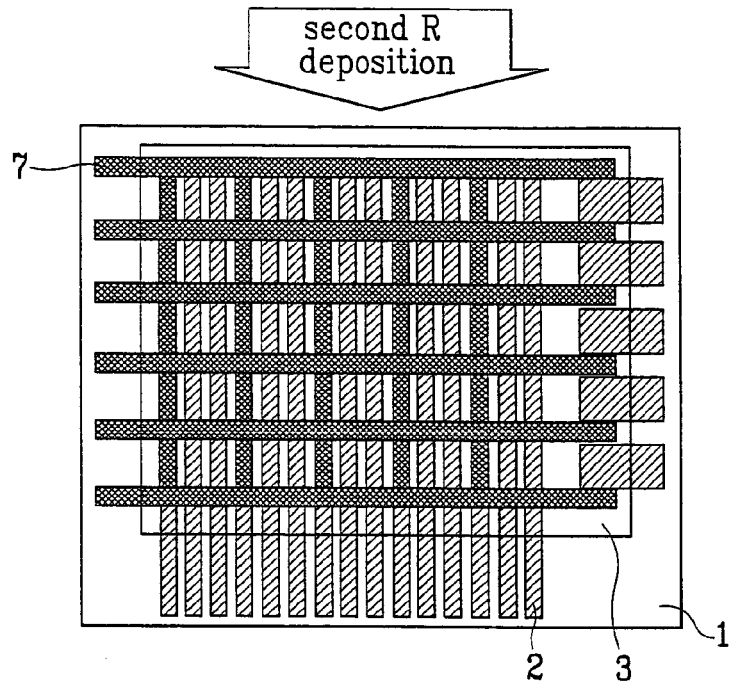
Figure 2D:
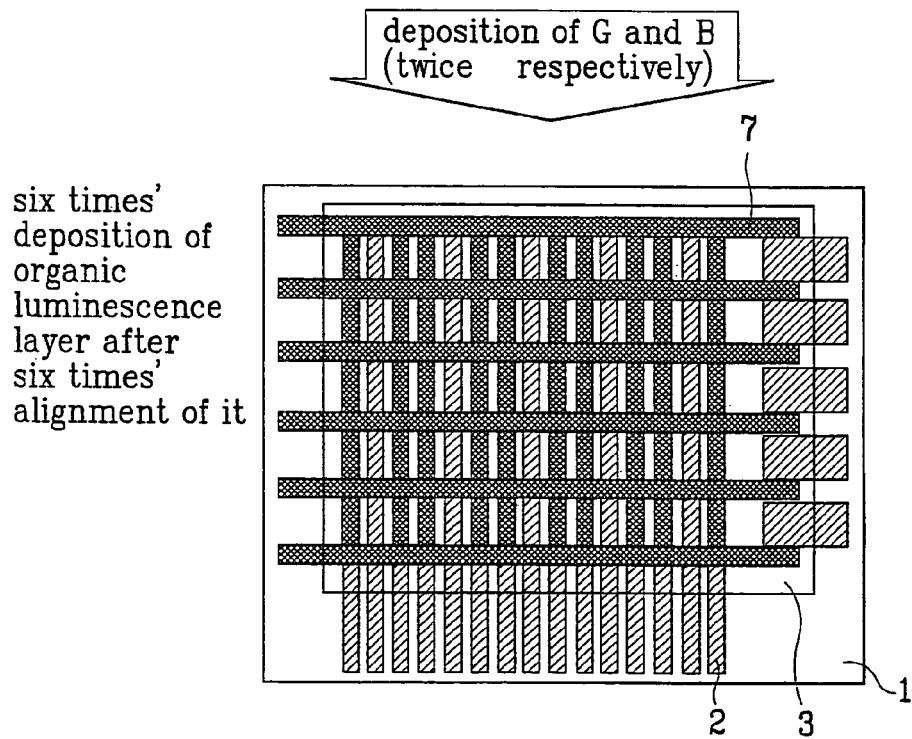
Figure 3A:
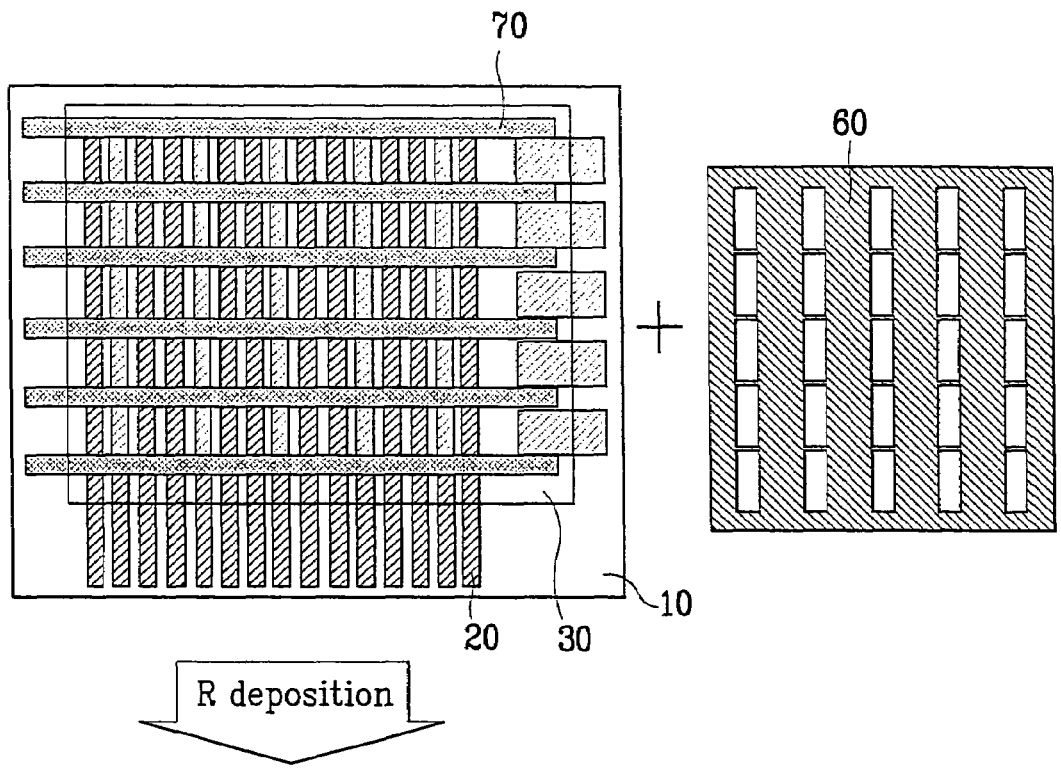
FIGS. 3A to 3D illustrate deposition process diagrams of an organic luminescence layer of a full-color organic EL display device using a shadow mask structure of the present invention.
Figure 3B:
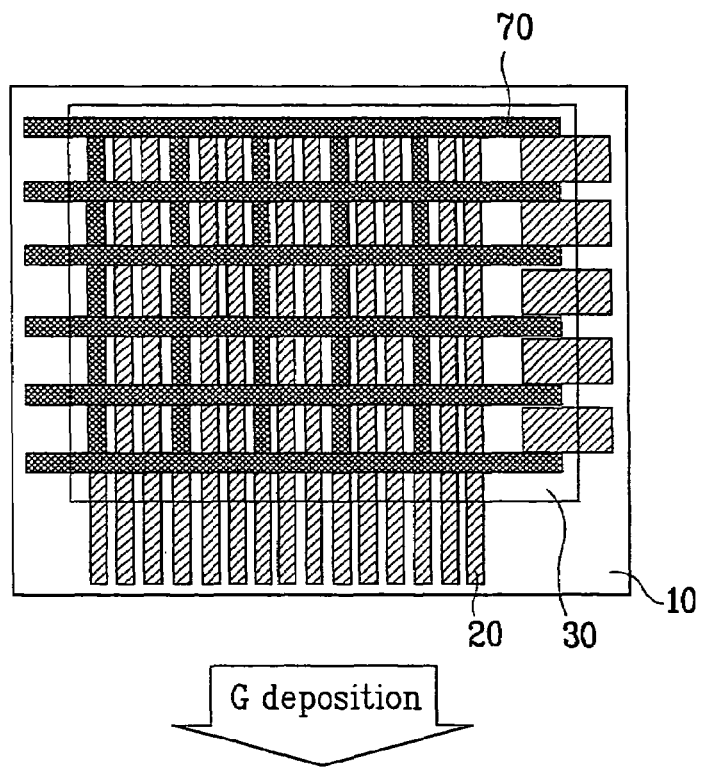
Figure 3C:
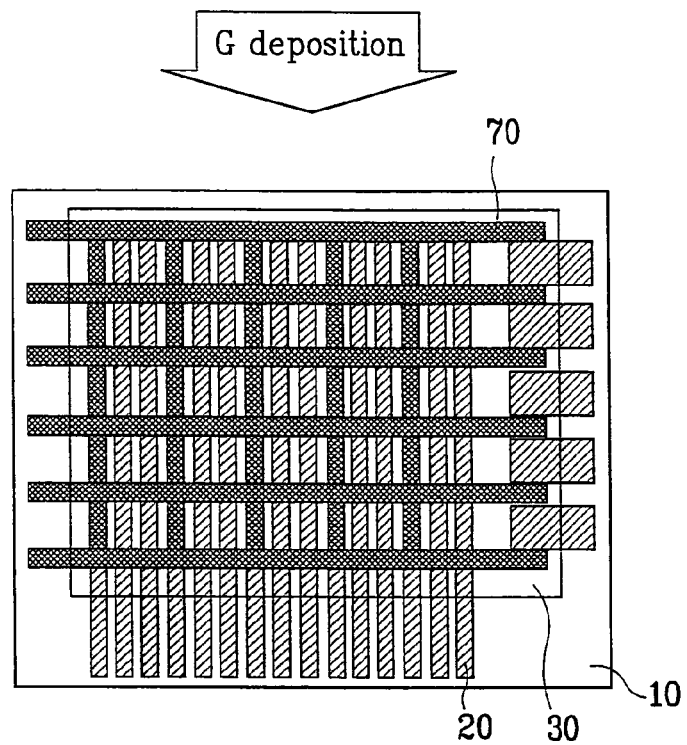
Figure 3D:
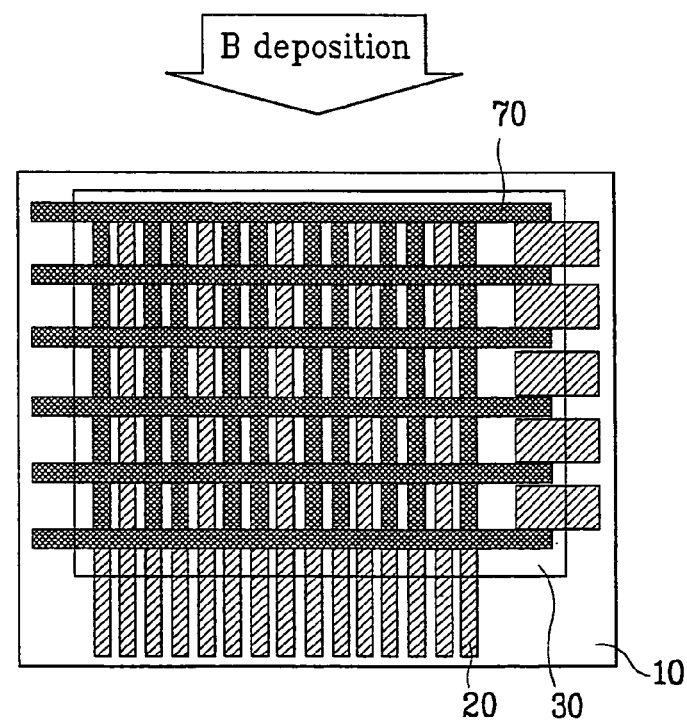

Referring to FIG. 3A, a first electrode 20 of a transparent electrode material is formed on a transparent substrate 10. A supplementary electrode may be applied to reduce the resistance of the first electrode 20. The substrate includes at least thin film transistors.

Metals which have relatively lower resistance than the resistance of the first electrode 20, such as Cr, Al, Cu, W, Au, Ni, and Ag, can be used as the supplementary electrode.

An insulating film 30 is formed on the first electrode 20. Any insulators, regardless of inorganic materials or organic materials, can be used as the insulating film 30.

A barrier 70 is formed on the insulating film 30 to insulate intervals of each second electrode (not shown).

Figure 4:
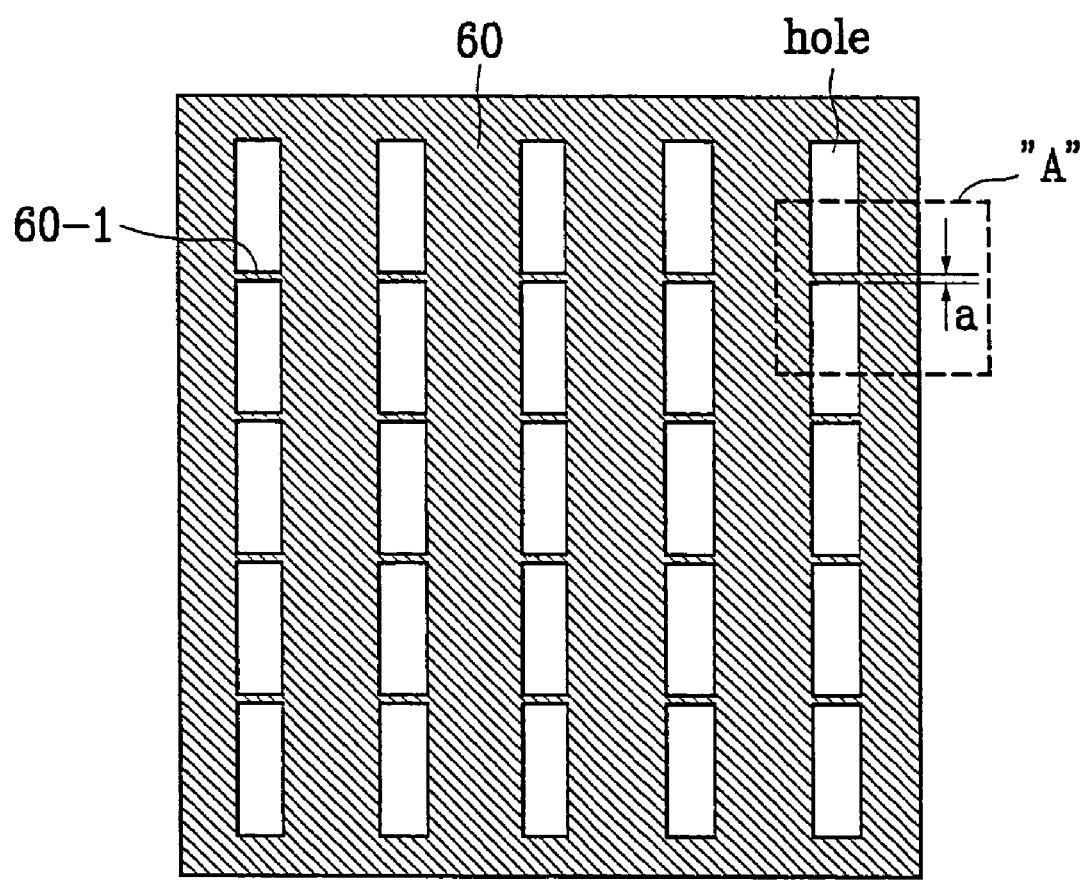
FIG. 4 illustrates a plane view of a shadow mask in accordance with the present invention.

As shown in FIG. 4, a shadow mask 60 is used to form each organic luminescence layer of R, G, and B and a common organic luminescence layer of the same at a plurality of pixels on the transparent substrate 10. The pixels are defined by a region crossed by the first and second electrodes.

FIG. 4 is a plane view of the shadow mask 60 in accordance of the present invention. The shadow mask 60 has a plurality of strip-shaped holes and a plurality of bridges 60-1 which connect the holes.

The transformation of the shadow mask 60 is prevented by the bridges 60-1 which connect the holes.

Referring to FIG. 3A, one bridge 60-1 for each pixel is formed, but the bridge 60-1 is not necessarily formed at every pixel. In consideration of the transformation of the shadow mask 60, the bridge may be formed between every two or three pixels.

Preferably, the bridge 60-1 has its width 'a' and thickness 'b' in the range of 1~1000 µm.

Figure 5A:
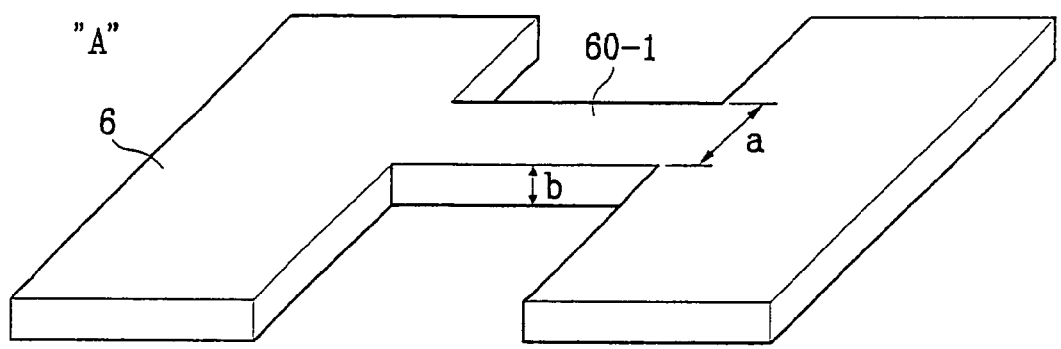
FIGS. 5A to 5C are detailed diagrams showing a part 'A' of the shadow mask of FIG. 4.
Figure 5B:
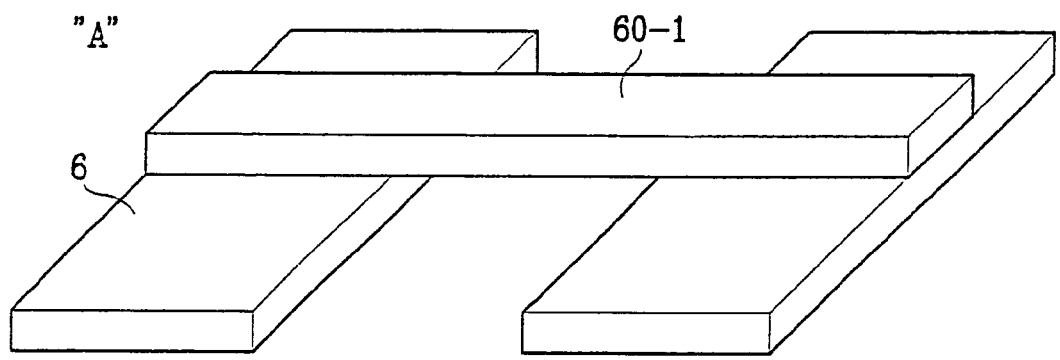
Figure 5C:
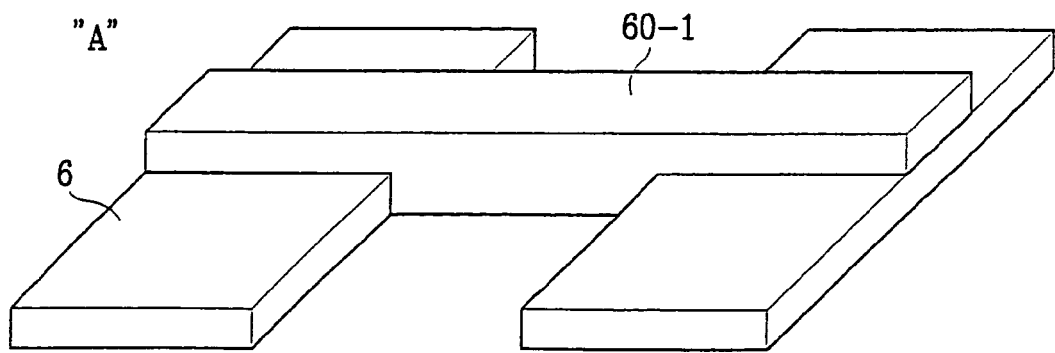

FIGS. 5A to 5C illustrate a detailed view of the part 'A' of the shadow mask of FIG. 4. The bridge 60-1 can be formed either on the same plane and at the same thickness as the shadow mask 60 as shown in FIG. 5A, or on a different plane and at a different thickness from the shadow mask 60 as shown in FIG. 5B. Alternatively, the bridge 60-1 can also be formed on the same or different plane as or from the shadow mask at a different thickness from the shadow mask 60 as shown in FIG. 5C.

A common luminescence layer of R, G, and B (not shown) is deposited on the transparent substrate 10 at a time using a blank mask which can deposit all the entire luminescence region.

Subsequently, each organic luminescence layer of R, G, and B is alternately arranged in rows at the pixel by three times aligning the shadow mask 60.

The common luminescence layer of R, G, and B may also be formed at each pixel of R, G, and B using the shadow mask 60, not being deposited on the entire luminescence region.

Subsequently, the second electrode (not shown) is formed by forming a second electrode (Mg—Ag alloy, or Al, or other conductive materials) using the blank shadow mask.

Then, passivation layers (oxygen adsorption layer, moisture adsorption layer, and moisture-proof layer) are formed on the second electrode and encapsulation is carried out.

The full-color organic EL display device in accordance with the present invention has the following advantages.

By forming mask holes in the form of a bridge, the transformation and droop of the shadow mask caused by the pulling strength is prevented. Thus, efficiency of the full-color organic EL display device is maximized.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A mask for fabricating organic luminescence layer of an organic electroluminescence display device, comprising:
   a plate having a plurality of holes, wherein the holes are formed as a striped shape extending in a column direction;

a first plurality of bridges crossing each of the holes along a first row direction; and a second plurality of bridges crossing each of the holes along a second row direction, wherein each of the bridges are formed on a different plane than the plate and a thickness of each of the bridges is substantially equal to a thickness of the plate, wherein lower surfaces of each of the bridges are on upper surface of the plate and wherein the plurality of holes define deposition areas on the organic electroluminescence display device on which material is to be deposited.

2. The mask of claim 1, wherein the bridges have their width and thickness in the range of 1~1000 μm.

3. A mask for fabricating organic luminescence layer of an organic electroluminescence display device, comprising:

a plate having a plurality of holes each having a width, wherein the holes are formed as a striped shape extending in a column direction;

a first plurality of bridges crossing each of the holes along a first row direction; and a second plurality of bridges crossing each of the holes along a second row direction, wherein each of the bridges are formed on a different plane than the plate and a thickness of each of the bridges is substantially equal to a thickness of the plate, wherein lower surfaces of the each of bridges are on upper surface of the plate and wherein each of the stripe-shaped holes is separated by a distance equal to about twice the width of the holes.

* * * * *